(12) United States Patent
Frodsham et al.

(10) Patent No.: US 7,366,964 B2
(45) Date of Patent: Apr. 29, 2008

(54) METHOD, SYSTEM, AND APPARATUS FOR LOOPBACK ENTRY AND EXIT

(75) Inventors: Tim Frodsham, Portland, OR (US); Naveen Cherukuri, San Jose, CA (US); Sanjay Dabral, Palo Alto, CA (US); David S Dunning, Portland, OR (US); Theodore Z Schoenborn, Portland, OR (US); Lakshminarayan Krishnamurty, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 10/897,596

(22) Filed: Jul. 23, 2004

(65) Prior Publication Data

US 2006/0020861 A1    Jan. 26, 2006

(51) Int. Cl.
*G01R 31/28* (2006.01)
*G01R 31/08* (2006.01)

(52) U.S. Cl. .................. 714/716; 714/713; 370/249
(58) Field of Classification Search ........... 714/716
See application file for complete search history.

(56) References Cited

U.S. PATENT DOCUMENTS

| 4,564,933 | A | * | 1/1986 | Hirst .................... 714/713 |
| 5,010,544 | A | * | 4/1991 | Chang et al. ............ 370/243 |
| 5,343,461 | A | * | 8/1994 | Barton et al. ............ 370/249 |

* cited by examiner

*Primary Examiner*—Jacques Louis-Jacques
*Assistant Examiner*—John J. Tabone, Jr.
(74) *Attorney, Agent, or Firm*—Trop, Pruner & Hu, P.C.

(57) ABSTRACT

A loopback test to test a communication link for a layered interface where in a master agent programs the electrical parameters for the slave agent, such as, the offset, timing, and current compensation with a loopback control register. The slave and master agent to support an entry into the loopback test based on detection of a header within a packet. The slave and master agent to support exit out of the loopback test based on whether the loop count is finite.

15 Claims, 5 Drawing Sheets

METHOD, SYSTEM, AND APPARATUS FOR LOOPBACK ENTRY AND EXIT

RELATED APPLICATIONS

The present U.S. Patent application is related to the following U.S. Patent applications: (1) application Ser. No. 10/897,569, with the same set of inventors, filed Jul. 23, 2004, entitled "METHOD, SYSTEM, AND APPARATUS FOR LOOPBACK PARAMETER EXCHANGE."

BACKGROUND OF THE INVENTION

1. Field of the Invention

The present invention relates to testing for high-speed point-to-point link networks. More particularly, the invention relates to how loop back testing may be applied for testing an interconnect architecture utilizing point-to-point links. For example, the following application details a loop back entry and exit scheme that may be used in connection with the other related patent application.

2. Description of the Related Art

As the technology for manufacturing integrated circuits advances, more logic functions are included in a single integrated circuit device or a system on a chip (SoC). Modem integrated circuit (IC) devices include large numbers of gates on a single semiconductor chip, with these gates interconnected so as to perform multiple and complex functions. The fabrication of an IC incorporating such Very Large Scale Integration (VLSI) must be error free, as any manufacturing defect may prevent the IC from performing all of the functions that an IC or SoC is designed to perform. Such demands require verification of the design of the IC or SoC and also various types of electrical testing after the IC or SoC is manufactured.

However, as the complexity of the ICs and SoCs increase, so does the cost and complexity of verifying and electrically testing the individual IC or multiple ICs in a system. Testing, manufacturing costs and design complexity increase dramatically because of the increasing number of functional pins on the integrated devices and SoC. With the increased number of I/O pins on each integrated device or system, the complexity and cost of testing each I/O pin has increased. Furthermore, the complexity of testing has increased with the advent of computer architectures utilizing multiple agents, such as, a plurality of caching agents and home agents coupled to a network fabric. For example, a scheme with a master and slave agent may require either of the following that increase testing complexity or utilize additional hardware resources: an external control for chip set agents, lack of standardization of testing high speed I/O interfaces, and testing registers for both master and slave agents.

BRIEF DESCRIPTION OF THE SEVERAL VIEWS OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

DETAILED DESCRIPTION OF THE INVENTION

Figure 1:
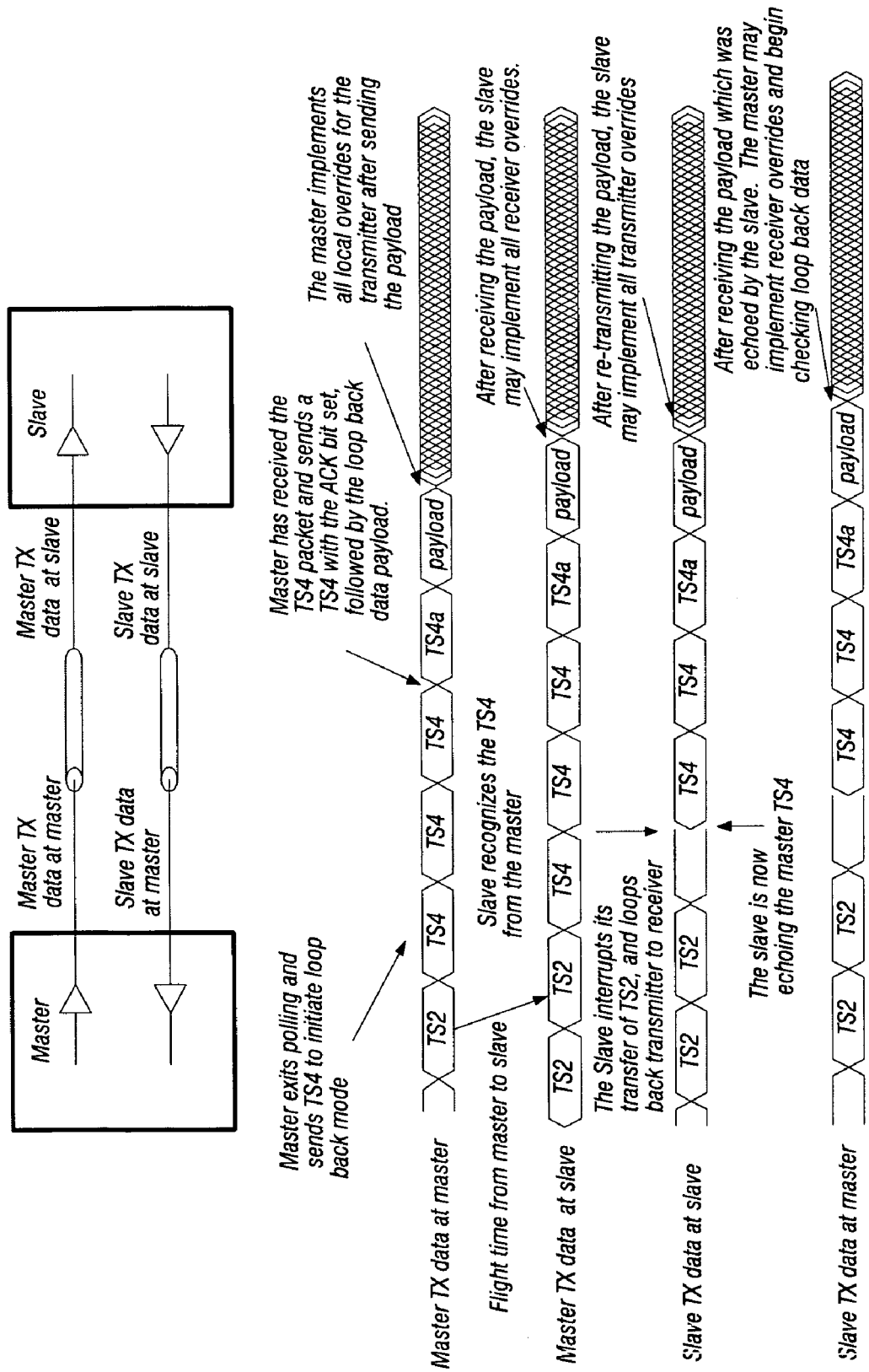
FIG. 1 illustrates a timing diagram for a loop back entry as utilized by an embodiment.

A method, apparatus, and system for loopback testing for a high speed point to point network (pTp) is described In the following description, for purposes of explanation, numerous details are set forth in order to provide a thorough understanding of the present invention. However, it will be apparent to one skilled in the art that these specific details are not required in order to practice the present invention.

An area of current technological development relates to reducing test complexity and cost. As previously described, DFT methods facilitate the testing of ICs and SoCs. In contrast, the claimed subject matter facilitates a master slave methodology for a loopback testing scheme for a pTp network that allows control of the loop back overrides on both agents from one master agent. For example, a master agent is used to control aspects of the loop back testing. In one embodiment, the master agent is a microprocessor. In another aspect, the claimed subject matter teaches a standard set of registers and bits for loop back testing that allows higher layers of test software to manipulate the registers and bits to enable and obtain complicated test programs and interface information. In this patent application, entry and exit of the loopback testing is discussed. In contrast, the loopback parameter exchange is discussed in connection with the related application.

The claimed subject matter facilitates loop back testing for a pTp architecture with a plurality of caching agents and home agents coupled to a network fabric. For example, the network fabric may comprise either or all of: a link layer, a protocol layer, a routing layer, a transport layer, and a physical layer. The fabric facilitates transporting messages from one protocol (home or caching agent) to another protocol for a point-to-point network in one embodiment, one pTp network is Intel's Common System Interface (CSI). In this embodiment, transmitters and receivers of a CSI port, or two different CSI ports are attached to each other. Subsequently, test patterns are generated and checked while the interface electrical and timing parameters are stressed. Therefore, the claimed subject matter describes a method for setting up the two agents involved in the loop back function by which one agent can control the various overrides in the transmitter and receiver of both agents involved. The agent controlling the override parameters is the master agent. The slave agent receives some or all loop back control and override from the master in band, and needs little to no external control. However, the override information may come from the master agent or a test access port (TAP). In this patent application, entry and exit of the loopback testing is discussed. In contrast, the loopback parameter exchange is discussed in connection with the related application.

The claimed subject matter facilitates a loopback entry and exit with handshaking. In contrast, the prior art teaches loopback entry and exit with explicit and dedicated control with specific pins dedicated to this function and may utilize timed counters.

In one embodiment, the loopback patterns are stored in a 40 bit deep single pattern generator register for all of the lanes of a communication link. In one embodiment, there are 20 lanes for the link.

FIG. 1 illustrates a timing diagram for a loop back entry as utilized by an embodiment.

As previously described, the claimed subject matter facilitates loop back testing. First, the loop back test is initiated by a loop back entry scheme that is depicted in this timing diagram and the flow diagram in FIG. 2. In one embodiment, entry into the loop back function is based at least in part on a predetermined header of a predetermined packet type. In this embodiment, the packet type is a "TS4" with a header to indicate loop back entry. In this embodiment, the packet header controls the entry into the loop back mode, provides override information for the slave agent, and also provides the synchronization and timing between the two agents. In this embodiment, the TS4 packet type has 8 bytes, with byte 0 used as a header with a value of "11100010". However, the claimed subject matter is not limited to an eight byte packet type with a header value of "11100010". One skilled in the art appreciates utilizing a different packet type with a different header value. The preceding embodiment is just one example.

In one embodiment, the latency between the master and the slave device is variable. For example, the latency may depend on various factors, such as, the routing length between the agents and the timing variance due to temperature and voltage excursions. From one initialization to the next, the latency between the two CSI agents can vary by several UI (unit intervals)

A synchronization is done to allow the slave agent to know when the loop back data has arrived. Likewise, the synchronization allows the master agent to know when the slave has acknowledged loop back entry, and when the loop back data has returned to the master and the master can begin checking. In one embodiment, the synchronization is done by the loop back header itself. The TS4 header is sent by the master to the slave. The slave recognizes the TS4 header. Consequently, the loop back path is set up and defined between the transmitter to receiver. The loop back master sees the TS4 packets coming back from the slave and knows that the slave has acknowledged and entered loop back mode. The master sets the ACK bit in a last TS4 packet, appends the payload and begins transmission of the test pattern. When the slave receives the TS4 with the ACK bit, the slave agent receives, interprets and implements the overrides in the payload packet which follows, then ignores subsequent pattern data. The TS4 packet with acknowledge is looped back to the master agent because the slave is in loop back mode. Consequently, the master knows when to expect the return of the pattern data it transmitted originally. Therefore, the master agent begins pattern checking.

The overrides in the payload packet refer to the offset, driver current, and sampling controls discussed in further detail in the related application.

Figure 2:
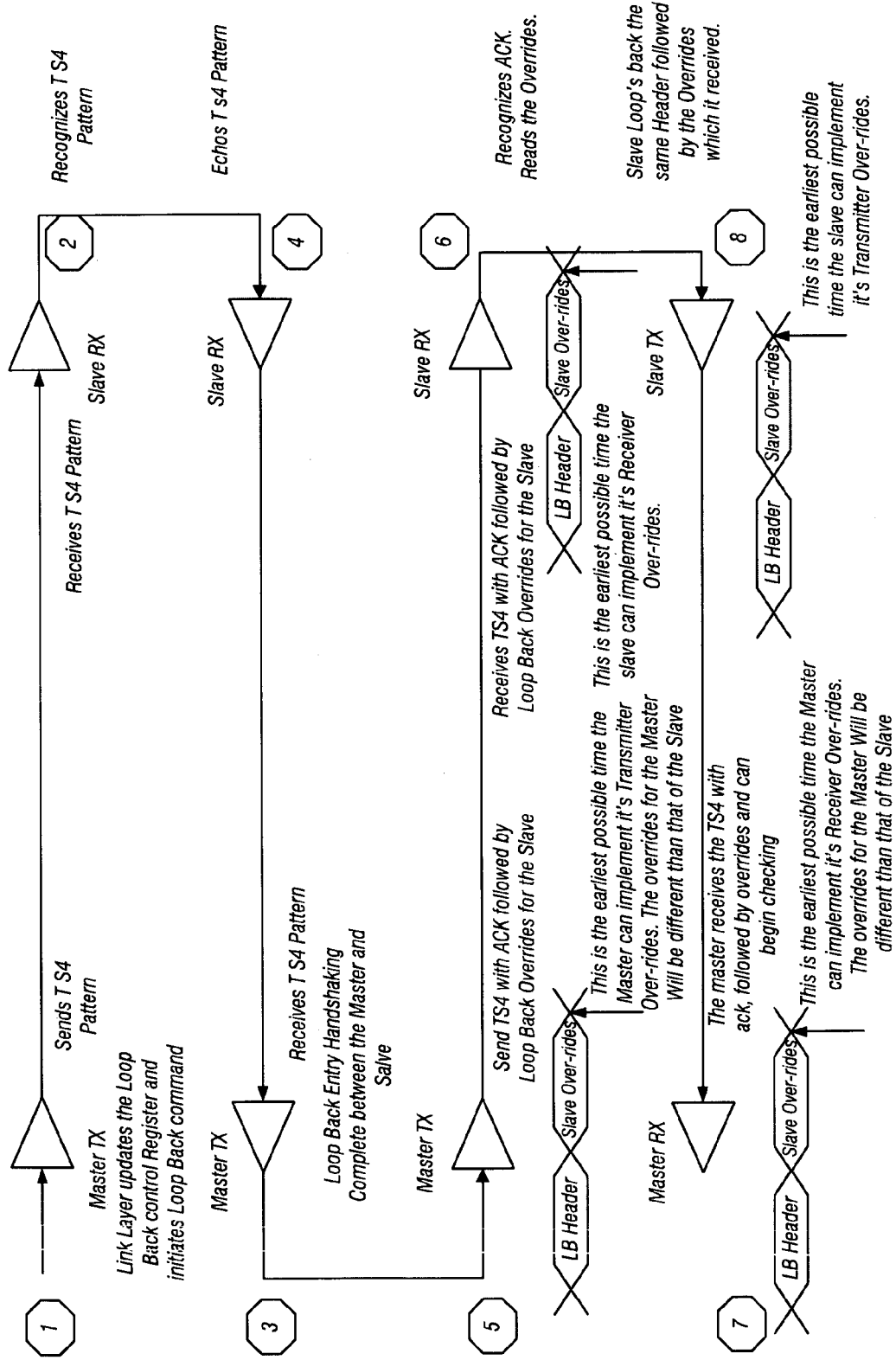
FIG. 2 illustrates a flow diagram for a loop back entry as utilized by an embodiment.

FIG. 2 illustrates a flow diagram for a loop back entry as utilized by an embodiment.

Label one indicates the loop back master agent sending a TS4 packet type after exiting the polling state (discussed in FIG. 1 of the related application), in contrast, the loop back slave agent continues to transmit TS2. Label 4 indicates that the slave agent receives TS4, consequently, it immediately stops current TS2 pattern it is transmitting and echoes back TS4 pattern back to the master (label 3).

Label 5 indicates the master looks at the looped back TS4 as an indication that slave entered loop back mode and sends TS4 with ACK bit set. Subsequently, the TS4 training sequence is followed by a test pattern (label 6)

Label 8 indicates that the slave agent receives TS4 with ACK bit set, it varies its $R_x$ parameters based on the data fields in TS4 and uses these new values to echo anything following TS4. It is important that slave switches to these new parameters only after echoing back TS4 so that master is guaranteed to receive TS4 with back correctly.

In one embodiment, the Master agent contains the necessary logic to look for pattern mismatches and appropriately updates the Loop Back status register with the results.

Figure 3:
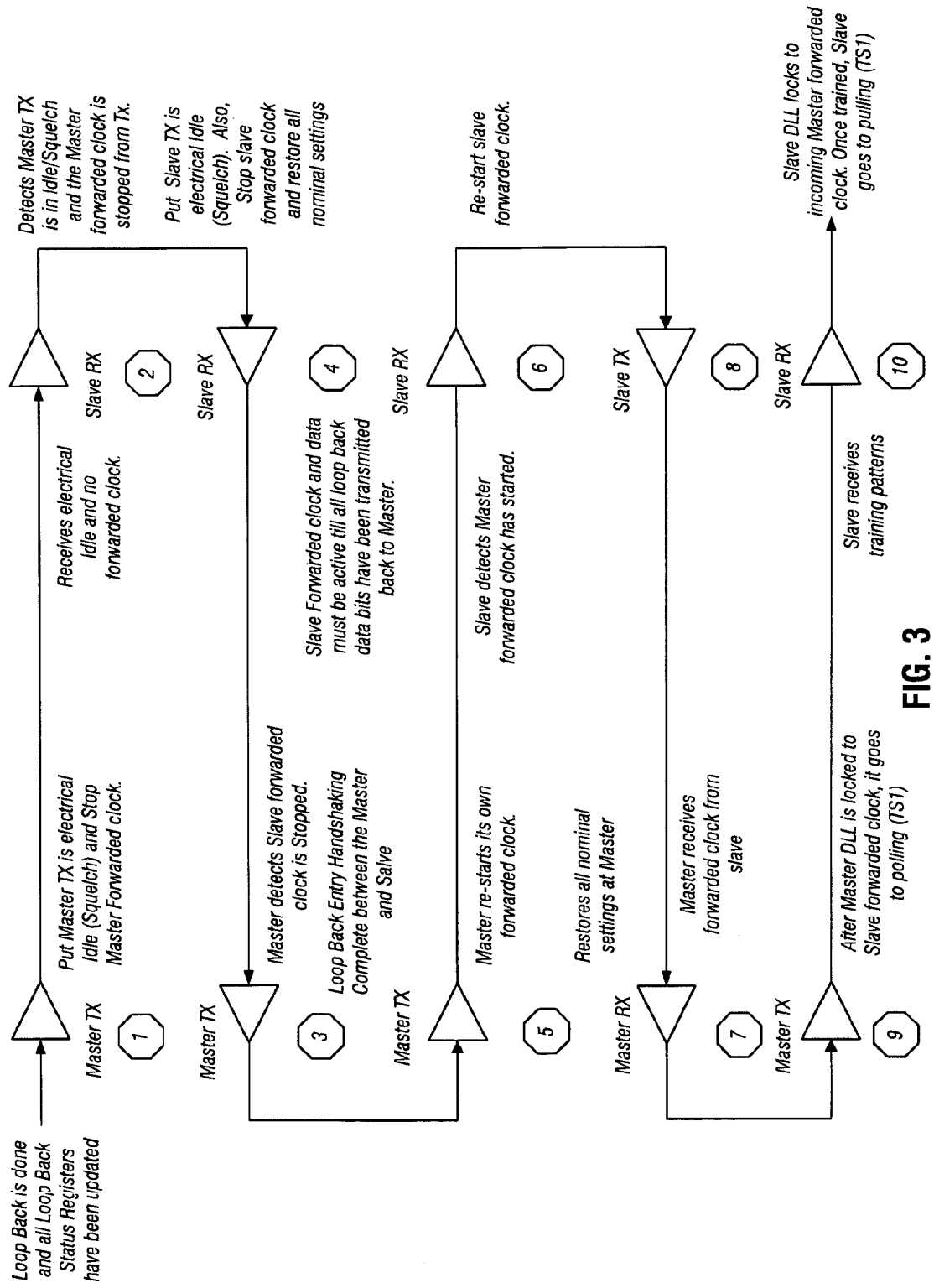
FIG. 3 illustrates a flow diagram for a loop back exit as utilized by an embodiment.

FIG. 3 illustrates a flow diagram for a loop back exit as utilized by an embodiment. There are two embodiments for loop back exit. If loop back was entered with a finite loop count, exit is seamless. When the requisite number of loop back patterns have been sent and received, the transmitter and receiver both drop out of loop back, restore the original settings; consequently, a loopback recovery packet is sent and a return to a polling state. In contrast, in another embodiment, the loop back count is infinite. For example, the loop back count is infinite when one seeks to perform design validation on the agents. Since the outbound link can be stressed and may result in the slave agent's receiver receiving garbage data. Therefore, handshaking is accomplished by dropping and restarting the forwarded clocks—an inband reset (discussed in further detail in connection with FIG. 4).

Figure 4:
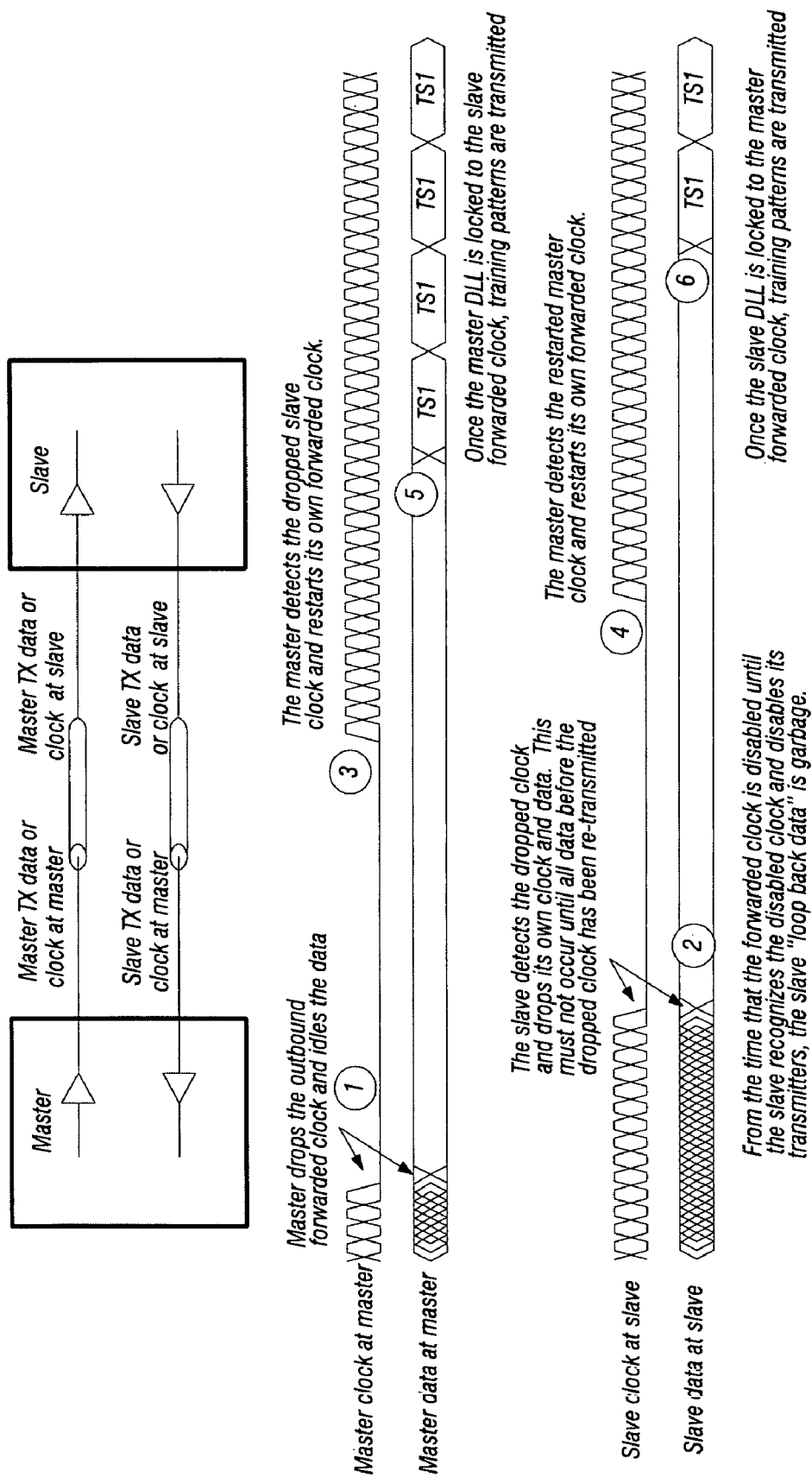
FIG. 4 illustrates a timing diagram for a loop back exit as utilized by an embodiment.

FIG. 4 illustrates a timing diagram for a loop back exit as utilized by an embodiment. In this embodiment, loop back exit is achieved with an in band reset. The master issues the in-band reset by stopping the forwarded clock, as indicated by label 1. The slave detects the loss of clock, exits loop back mode and acknowledges this by issuing its own in-band reset, as indicated by label 2. The master detects the in-band reset from the slave, and knowing that the loop back exit has been acknowledged, re-starts the clock and begins link initialization as indicated by labels 3-6.

Figure 5:
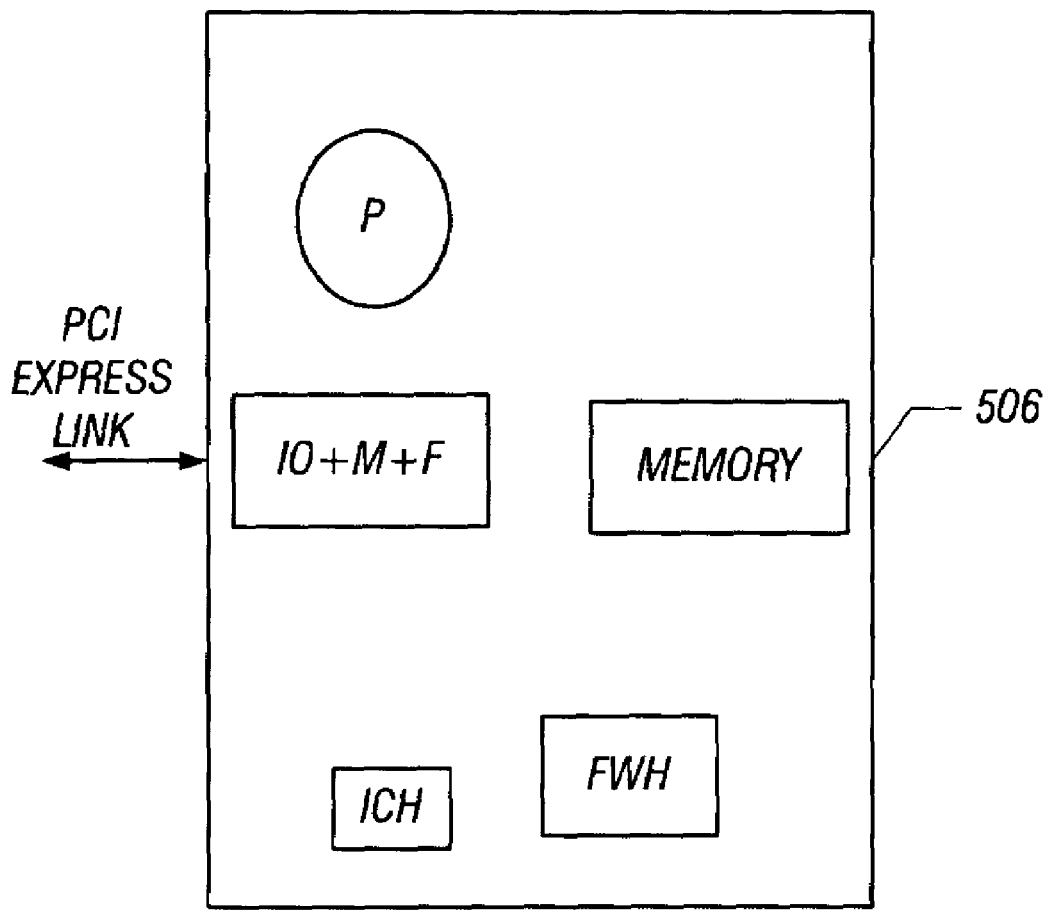
FIG. 5 illustrates multiple embodiments of systems as utilized by one embodiment.
Figure 5:
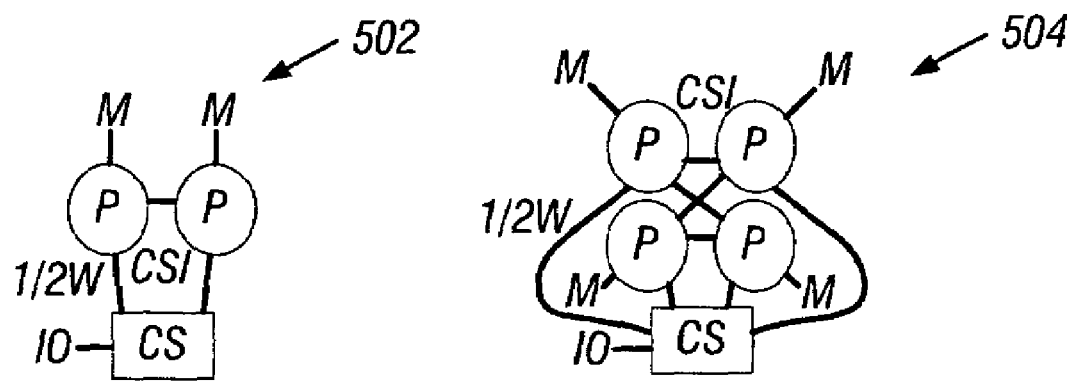

FIG. 5 depicts a point-to-point system with one or more processors. The claimed subject matter comprises several embodiments, one with one processor 506, one with two processors (P) 502 and one with four processors (P) 504. In embodiments 502 and 504, each processor is coupled to a memory (M) and is connected to each processor via a lo network fabric may comprise either or all of: a link layer, a protocol layer, a routing layer, a transport layer, and a physical layer. The fabric facilitates transporting messages from one protocol (home or caching agent) to another protocol for a point-to-point network. As previously described, the system of a network fabric supports any of the embodiments depicted in connection with the preceding Figures and Tables.

For embodiment 506, the uni-processor P is coupled to graphics and memory control, depicted as IO+M+F, via a network fabric link that corresponds to a layered interface. The graphics and memory control is coupled to memory and is capable of receiving and transmitting via PCI Express Links. Likewise, the graphics and memory control is coupled to the ICH. Furthermore, the ICH is coupled to a firmware hub (FWH) via a LPC bus. Also, for a different uni-processor embodiment, the processor would have external network fabric links. The processor may have multiple cores with split or shared caches with each core coupled to an Xbar router and a non-routing global links interface.

Thus, the external network fabric links are coupled to the Xbar router and a non-routing global links interface.

Although the claimed subject matter has been described with reference to specific embodiments, this description is not meant to be construed in a limiting sense. Various modifications of the disclosed embodiment, as well as alternative embodiments of the claimed subject matter, will become apparent to persons skilled in the art upon reference to the description of the claimed subject matter. It is contemplated, therefore, that such modifications can be made without departing from the spirit or scope of the claimed subject matter as defined in the appended claims.

The invention claimed is:

1. A method for an entry into a loopback test configured for a master agent and a slave agent comprising:
    exiting a polling state;
    sending a predetermined packet type from the master agent to the slave agent;
    recognizing the predetermined packet type by setting up a loopback path between a transmitter and a receiver;
    sending a final predetermined packet type having an acknowledgment indicator prior to sending a payload with override information from the master agent to the slave agent; and
    implementing the payload override information by the slave agent.

2. The method of claim 1, wherein the override information is an offset for a variable offset comparator, an offset for a strobe, and output current compensation.

3. A method for an entry into a loopback test configured for a master agent and a slave agent comprising:
    sending a predetermined packet type from the master agent to the slave agent;
    recognizing the predetermined packet type by setting up a loopback path between a transmitter and a receiver;
    recognizing the slave agent has entered loop back mode;
    setting an acknowledge bit in the predetermined packet type and sending a payload with override information from the master agent to the slave agent;
    implementing the payload override information by the slave agent;
    sending the predetermined packet type with the acknowledge bit being sent back to the master agent; and
    pattern checking by the master agent.

4. The method of claim 3, wherein recognizing the slave agent has entered loop back mode is by receiving the predetermined packet type with a predetermined value within a header of the packet.

5. The method of claim 3, wherein the override information is an offset for a variable offset comparator, an offset for a strobe, and output current compensation.

6. A method for an exit out of a loopback test configured for a master agent and a slave agent comprising:
    exiting the loopback test based at least in part on whether a loop count is finite;
    exiting the loopback test when the loop count has expired;
    restoring an original setting for override information implemented in a receiver and a transmitter of the slave agent during the loopback test;
    sending a recovery packet; and
    returning to a polling state.

7. The method of claim 6, wherein the override information is an offset for a variable offset comparator, an offset for a strobe, and output current compensation.

8. A method for an exit out of a loopback test configured for a master agent and a slave agent comprising:
    exiting the loopback test based at least in part on whether a loop count is finite;
    if the loop count is finite, a transmitter and receiver exiting the loopback test when the loop count has expired;
    restoring an original setting for override information;
    sending a recovery packet;
    returning to a polling state;
    otherwise if the loop count is not finite, issuing an in-band reset from the master agent to the slave agent.

9. The method of claim 8, wherein the override information is an offset for a variable offset comparator, an offset for a strobe, and output current compensation.

10. The method of claim 8, wherein the in-band reset comprises: dropping a forwarded clock and eventually restarting the forwarded clock.

11. A method for an exit out of a loopback test configured for a master agent and a slave agent comprising:
    exiting the loopback test for an infinite loop count for the loopback test;
    issuing an in-band reset by the master agent to stop a forwarded clock;
    detecting the loss of forwarded clock and exiting the loopback test by the slave agent; and
    restarting the forwarded clock when the master agent detects an in-band reset issued by the slave agent.

12. The method of claim 11, further comprising bypassing the in-band reset for a finite loop count.

13. A system to support a loopback test for a communication link for a layered interface that allows a master agent to control a slave agent comprising:
    a transmitter and a receiver of the master agent to support an entry into the loopback test upon detection of a predetermined value in a header of a packet received by the receiver of the master agent;
    a transmitter and a receiver of the slave agent to restore an original setting for override information implemented in the receiver and the transmitter of the slave agent during the loopback test if a loop count is finite; and
    wherein the master agent and the slave agent are to support an exit out of the loopback test based on whether the loop count is finite, and the transmitter of the master agent is to issue an in-band reset to the receiver of the slave agent if the loon count is not finite.

14. The system of claim 13, wherein the override information is an offset for a variable offset comparator, an offset for a strobe, and output current compensation.

15. The system of claim 13, wherein the master agent is to drop a forwarded clock and eventually restart the forwarded clock upon detection of the in-band reset by the slave agent.

* * * * *

UNITED STATES PATENT AND TRADEMARK OFFICE
CERTIFICATE OF CORRECTION

PATENT NO. : 7,366,964 B2  Page 1 of 1
APPLICATION NO. : 10/897596
DATED : April 29, 2008
INVENTOR(S) : Frodsham It is certified that error appears in the above-identified patent and that said Letters Patent is hereby corrected as shown below:

Column 6:
Line 50, "loon" should be --loop--.

Signed and Sealed this

Fifteenth Day of July, 2008

JON W. DUDAS
*Director of the United States Patent and Trademark Office*